(12) United States Patent
Nakazaki et al.

(10) Patent No.: US 7,145,348 B2
(45) Date of Patent: Dec. 5, 2006

(54) SENSOR DEVICE WITH COATED ELECTRIC WIRE SHIELDING

(75) Inventors: Takao Nakazaki, Takatsuki (JP); Hiroyuki Tsuchida, Ayabe (JP); Koro Kitajima, Suita (JP); Mitsuo Hatada, Ayabe (JP); Kazuaki Miyamoto, Fukuchiyama (JP); Shinjiro Kotani, Fukuchiyama (JP); Kazushi Tanase, Gaertringen (DE); Masahiko Shibayama, Fukuchiyama (JP); Shoichi Konishi, Fukuchiyama (JP)

(73) Assignee: Omron Corporation, Kyoto (JP)

( * ) Notice: Subject to any disclaimer, the term of this patent is extended or adjusted under 35 U.S.C. 154(b) by 45 days.

(21) Appl. No.: 10/697,571

(22) Filed: Oct. 31, 2003

(65) Prior Publication Data

US 2004/0135572 A1 Jul. 15, 2004

(30) Foreign Application Priority Data

Nov. 1, 2002 (JP) .......................... P2002-320460

(51) Int. Cl.
*H05K 9/00* (2006.01)

(52) U.S. Cl. ..................................... 324/627; 361/818

(58) Field of Classification Search ........... 324/207.26, 324/207.16, 158.1, 234, 627, 546, 127, 754
See application file for complete search history.

(56) References Cited

U.S. PATENT DOCUMENTS 3,665,298 A * 5/1972 Geiger ....................... 324/239
3,684,955 A * 8/1972 Adams ........................ 324/72
3,747,036 A * 7/1973 Erdmann .................. 336/84 R
4,700,131 A * 10/1987 Miller ..................... 324/117 H
5,066,904 A * 11/1991 Bullock ....................... 324/127
5,682,412 A * 10/1997 Skillicorn et al. ......... 378/98.6
5,801,530 A * 9/1998 Crosby et al. ......... 324/207.26
6,069,393 A * 5/2000 Hatanaka et al. ........... 257/434
6,175,295 B1 * 1/2001 Honma ..................... 336/84 R
6,522,254 B1 * 2/2003 Yamano ..................... 340/630
6,713,685 B1 * 3/2004 Cotton ........................ 174/262
2002/0011832 A1 * 1/2002 Berkcan et al. ............. 324/127

FOREIGN PATENT DOCUMENTS

JP 56-1436 6/1979
JP 11-195542 7/1999

* cited by examiner

*Primary Examiner*—Anjan Deb
(74) *Attorney, Agent, or Firm*—Foley & Lardner LLP

(57) ABSTRACT

A coated electric wire is wound around a detection circuit in a planar manner for the purpose of electrostatic shield. This winding is performed, for example, spirally in a single layer. In the case where there are further provided a detection circuit board including a detection circuit and a cylindrical case, the coated electric wire is wound around the detection circuit board in a planar manner, wherein the direction of the axis of the cylindrical surface accords with the direction of the axis of the case. Consequently, there can be provided a sensor device in which the detection circuit can be electrostatically shielded with ease.

10 Claims, 17 Drawing Sheets

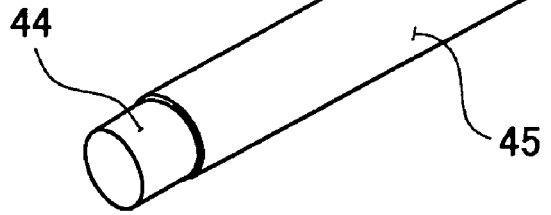
FIG.13A – SINGLE-LAYER COATED ELECTRIC WIRE
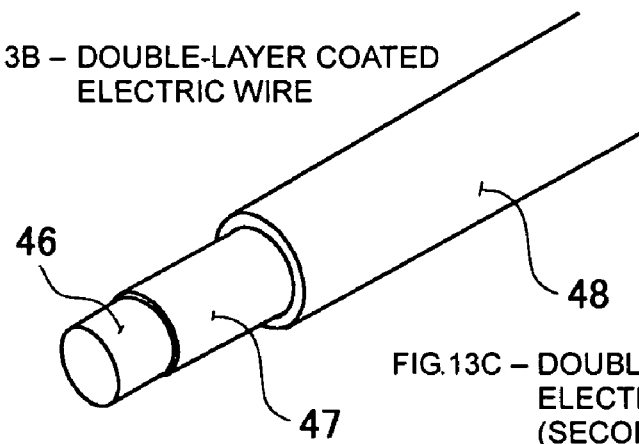
FIG.13B – DOUBLE-LAYER COATED ELECTRIC WIRE
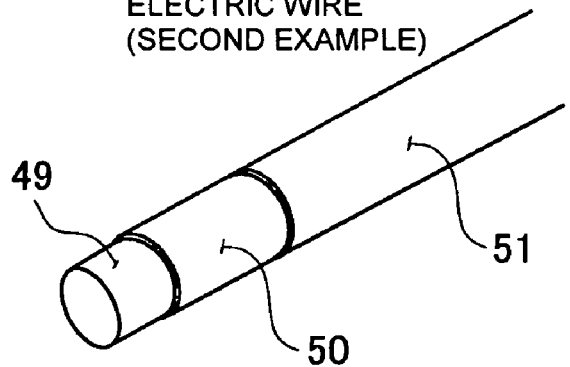
FIG.13C – DOUBLE-LAYER COATED ELECTRIC WIRE (SECOND EXAMPLE)
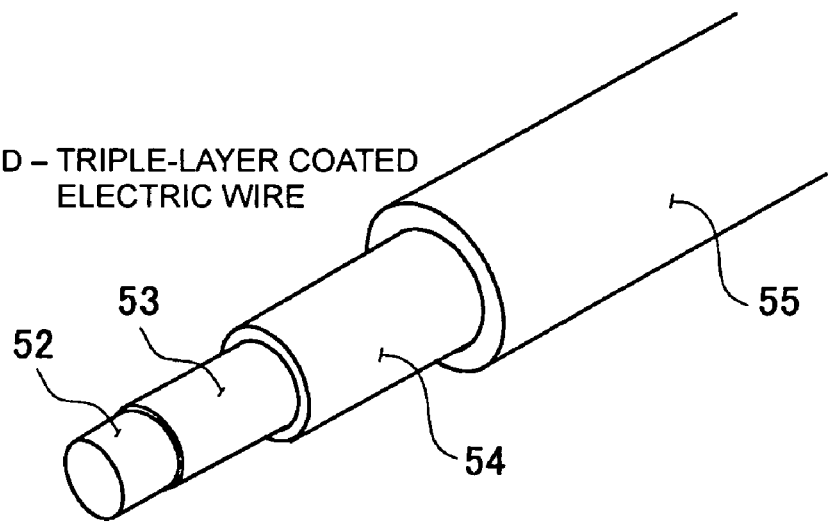
FIG.13D – TRIPLE-LAYER COATED ELECTRIC WIRE

SENSOR DEVICE WITH COATED ELECTRIC WIRE SHIELDING

BACKGROUND OF THE INVENTION

1. Field of the Invention

The present invention relates to a sensor device, in which a detection circuit is electrostatically shielded.

2. Description of the Prior Art

In a proximity sensor of an induction type, there has been known that an insulating flexible film having a conductor pattern is wound around a printed wiring board having a circuit unit mounted thereon, so that the printed wiring board is electrostatically shielded, and further, that the conductor pattern is soldered to a deposition film formed at the back surface of a core (see Patent Literature 1 which is Japanese Patent Application Laid-open No. 1,436/1981).

Furthermore, there has been known that in a coil device, in which a coil wire is applied to a magnetic core, a fine wire of a metallic magnet such as permalloy or silicon steel is wound around the coil wire, so that the coil wire is magnetically shielded (see Patent Literature 2 which is Japanese Patent Application Laid-open No. 195,542/1999).

The proximity switch which adopts the electrostatic shield structure disclosed in Patent Literature 1 has raised problems that: a film with a copper foil, which is subjected to secondary machining in a complicated shape and is expensive in material cost, is needed in each kind of sensor; it is cumbersome to manually wind the film with a copper foil having a complicated shape around the circuit board, thereby increasing the man-hours of assembly; it is difficult to automatically wind the film with a copper foil having a complicated shape around a circuit board; the man-hours of soldering a copper foil portion of the film with a copper foil to a GND pattern of the circuit board is large; it is difficult to automatically solder the copper foil portion of the film with a copper foil to the GND pattern of the circuit board; a film with a complicated electrostatic shield copper foil is needed by disposing a lead wire or a welded portion for electrically welding the metallic deposition portion of the core to the GND pattern of the circuit board; it is difficult to automatically solder the metallic deposition portion of the core and the GND pattern of the circuit board to each other by the use of the lead wire or the film with a copper foil; it is necessary to apply an insulating layer to the surface of the film with a copper foil in order to secure an insulating property between electronic parts or a sheath case, thereby requiring the film with a copper foil excellent in material cost; the surface of the insulating layer is peeled off when the insulating layer scrapes on the edge of the circuit board or the like since the insulating layer is relatively thin, thereby inducing short-circuiting between the electronic parts or circuit patterns; and the like.

The shield structure disclosed in Patent Literature 2 has not been suitable for electrostatically shielding a detection circuit in a sensor device since a member to be shielded is not a circuit board but a coil and a magnetic material wire is thickly wound for the purpose of magnetic shielding.

SUMMARY OF THE INVENTION

In view of the above-described problems observed in the prior art, an object of the present invention is to provide a sensor device capable of electrostatically shielding a detection circuit with ease.

Other objects, functions and effects of the present invention will be readily understood by one skilled in the art in consideration of the description below in the specification.

In a sensor device according to the present invention, a coated electric wire is wound around a detection circuit in a planar manner for the purpose of electrostatic shield.

With the above-described configuration, since there is formed a conductor layer having the coated electric wire wound in a planar manner around the detection circuit, which is generally susceptible to an influence of noise in the sensor device, the detection circuit can be electrostatically shielded by stabilizing the potential of the coated electric wire via grounding. Since the electrostatic shielding is directed, it is preferable that the material of a core wire of the coated electric wire should be low in electric resistance such as copper without any necessity of inclusion of a magnetic material. The detection circuit may be mounted on a circuit board, or may be a simple introducing-out path for an output signal in a transducer for converting a physical quantity into an electric signal, for example, a metallic lead frame.

Since the electrostatic shielding is directed, it is sufficient that the coated electric wire is thinly wound. For example, the coated electric wire may be spirally wound around the detection circuit in a single manner. In this manner, it is easy to miniaturize the sensor device because the thickness of a shield layer can be miniaturized while achieving the effect of the electrostatic shielding.

The sensor device may comprise a detection circuit board having the detection circuit; and a cylindrical case. In a preferred embodiment according to the present invention in that case, the coated electric wire is wound around the detection circuit board in a cylindrical manner, and the direction of an axis of the cylindrical surface accords with the direction of the axis of the case. With this configuration, the space defined inside of the case can be effectively used.

In one preferred embodiment according to the present invention, the sensor device is a proximity sensor device comprising a detection coil having a core, wherein the detection circuit includes an oscillation circuit having the detection coil serving as a resonance element. The proximity sensor device includes a product called a proximity switch.

In the proximity switch according to the present invention, a metallic film for electrostatically shielding the detection coil may be formed at the outer surface of the core, and the coated electric wire may be electrically connected to the metallic film of the core. In this manner, the detection coil also can be electrostatically shielded.

In this case, there may be provided a detection circuit board having the detection circuit; wherein both ends of the coated electric wire may be electrically connected to the metallic film of the core, and are electrically connected to a ground pattern of the detection circuit board at the intermediate portion of the coated electric wire. A stress of a filled resin is liable to be exerted on the connected portion between the coated electric wire and the metallic film of the core. Consequently, if both ends of the coated electric wire are connected, the electrostatic shielding with respect to the detection coil can be maintained even if one of both ends is disconnected.

In the coil wire of the detection coil in the proximity sensor device, a high coating strength is not required, although the high density of the core wire at the time of winding is required. In contrast, in the coated electric wire wound around the detection circuit, unintended electric short-circuiting with the detection circuit must be prevented, although the high density of the core wire at the time of winding is not required. Therefore, it is preferable that the coating strength of the coated electric wire for use in shielding should be greater than that of the coated electric wire to be used as a coil wire of the detection coil.

However, in the case where there is no possibility of short-circuiting between the coated electric wire and the detection circuit, the coated electric wire for use in shielding may be the same kind of coated electric wire to be used as a coil wire of the detection coil. In this manner, it is possible to facilitate a fabricating process.

A sensor device in another preferred embodiment according to the present invention is an photoelectric sensor device including a light receiving element for converting light from a region to be detected into an electric signal, wherein a signal relating to the state of the region to be detected is output based on an output from the light receiving element. The photoelectric sensor device includes products called an photoelectric switch, a photomicro sensor and a photomicro switch. The detection circuit in the photoelectric sensor device may be a simple introducing-out path of an output signal from a light receiving element, but in many cases, it includes a light receiving circuit for amplifying the output signal from the light receiving element. In the case where there is a determination circuit for determining an object to be detected based on the output signal from the light receiving circuit, the determination circuit may be electrostatically shielded. In the case of an photoelectric sensor device further comprising a light projecting element, a light projecting circuit for allowing the light projecting element to emit light, and a central processing circuit for controlling the light projecting circuit and determining the object to be detected based on the output signal from the light receiving circuit, the central processing circuit may be electrostatically shielded.

In the photoelectric sensor device according to the present invention, the coated electric wire may be wound also around the light receiving element in a planar manner. In this manner, not only the detection circuit but also the light receiving element can be electrostatically shielded in the process of winding the coated electric wire.

In the photoelectric sensor device in the preferred embodiment according to the present invention, there are further provided a detection circuit board having the detection circuit; a cylindrical case; and a semi-split cylindrical board holder which supports the detection circuit board and is contained inside of the case; wherein the coated electric wire is wound around the detection circuit board and the board holder in a planar manner. The coated electric wire may be wound around the light receiving element in a planar manner.

According to the present invention, it is possible to electrostatically shield the detection circuit in the sensor device with ease.

BRIEF DESCRIPTION OF THE DRAWINGS

FIGS. 13A to 13D illustrate examples of applicable electric wires.

DESCRIPTION OF THE PREFERRED EMBODIMENTS

Figure 1:
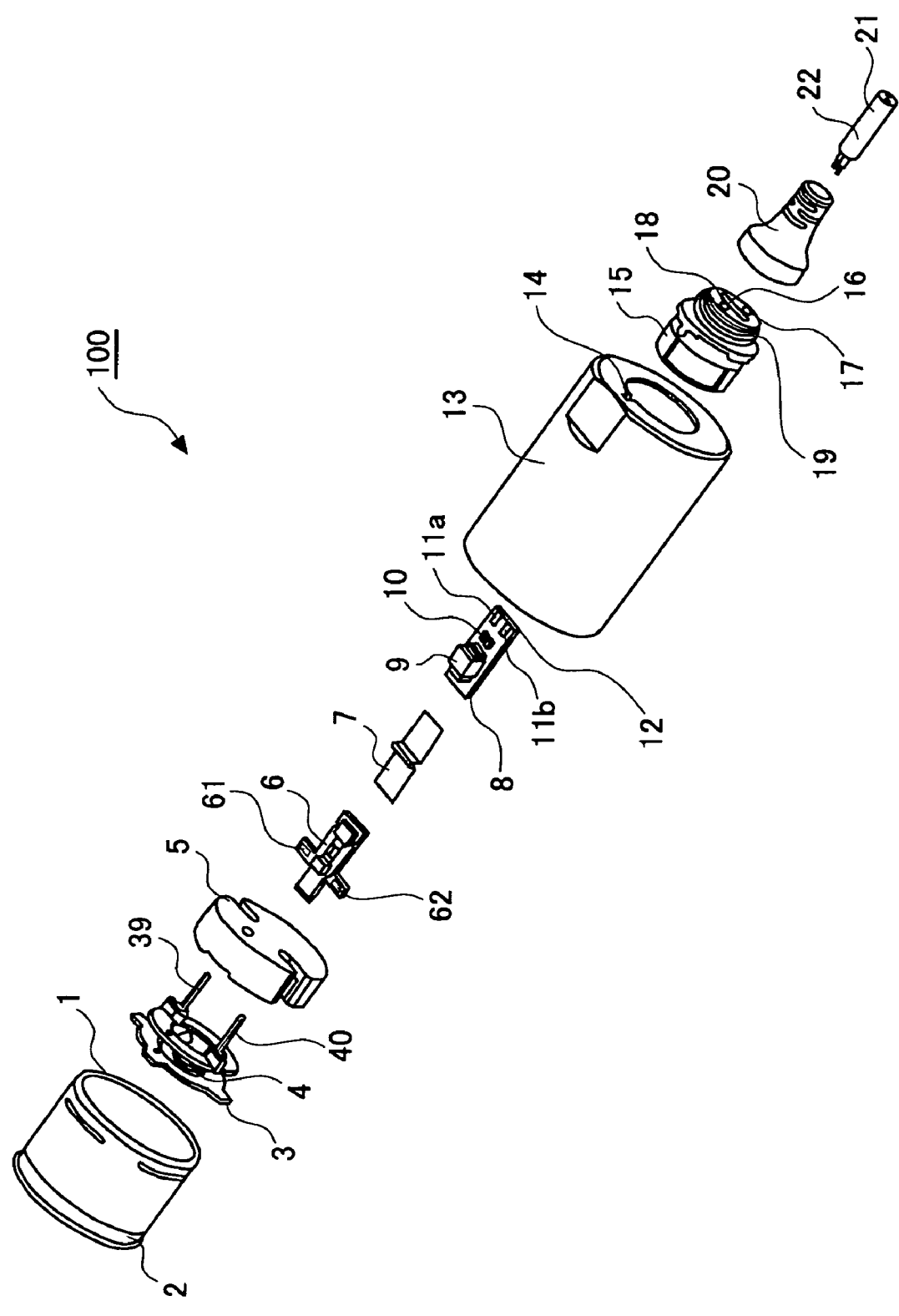
FIG. 1 is an exploded perspective view showing a proximity sensor.

A proximity sensor in a preferred embodiment according to the present invention will be described below in reference to the accompanying drawings. FIG. 1 is an exploded perspective view showing a proximity sensor, to which a winding coil shield structure according to the present invention is applied. Incidentally, the proximity sensor has been previously proposed by the present applicant (see the pamphlet of WO No. 02/075,763), in which all of parts constituting the proximity sensor are integrated in several modules, so as to reduce the man-hours of assembly, thereby achieving the cost reduction.

That is to say, the parts of the proximity sensor are integrated in a detection end module SMJ, described later, a connecting member module CMJ, described later, and an output circuit module OMJ, described later.

Explanation will be made on the detection end module SMJ. The detection end module SMJ includes a detection coil 4 wound around a spool 3 made of a resin; a ferrite core 5, in which the detection coil 4 is disposed; a coil case 1 made of a resin, for containing the detection coil 4 and the ferrite core 5 therein; and a detection circuit board 6, on which a detection circuit including an oscillation circuit having the detection coil 4 as a resonance element is mounted. The detection coil 4 and the detection circuit board 6 are connected to each other by soldering coil terminal pins 39 and 40 on the side of the detection coil 4 to connecting pads 61 and 62 on the side of the detection circuit board 6. The assembly consisting of the spool 3 having the detection coil 4 wound therearound, the ferrite core 5 and the detection circuit board 6 in an integral manner is contained inside of the coil case 1 made of a resin, and thereafter, a primary injection type resin is filled in the coil case 1. Here, reference numeral 2 designates a ring-like mask conductor fitted around the outer periphery at the tip of the coil case 1. As previously proposed by the present applicant, the existence of the mask conductor 2 makes the characteristics of the detection end module SMJ constant irrespective of the existence or material of a sheath case 13, thereby achieving self completion.

Next, a description will be given of the connecting member module CMJ. The connecting member module CMJ is constituted of a harness 7 as a film-like wiring board. A plurality of wiring patterns are formed in parallel on the harness 7 along a longitudinal direction. The harness 7 is folded in a V shape at the intermediate portion thereof, and therefore, it can readily cope with the sheath case 13 having any length.

Subsequently, explanation will be made on the output circuit module OMJ. The output circuit module OMJ comprises an output circuit board 8, on which an output circuit IC 9, a light emitting diode 10 and the like are mounted. At the rear end 12 of the output circuit board 8 are disposed terminal pads 11*a* and 11*b*.

The above-described detection end module (including the coil case 1, the mask conductor 2, the spool 3, the detection coil 4, the ferrite core 5 and the detection circuit board 6) and the above-described output circuit module OMJ (including the output circuit board 8) are connected to each other via the connecting member module (including the harness 7), and are contained inside of the cylindrical sheath case 13 opened at both ends thereof. At this time, an opening at the tip of the sheath case 13 is closed since the coil case 1 is press-fitted. Furthermore, an opening at the rear end of the sheath case 13 is closed by an end plug 15. At the rear end of the end plug 15 are formed a slit 16, through which the rear end 12 of the output circuit board 8 projects, an injection port 17 for use in injecting a secondary injection type resin and an exhaust port 18, through which inside air is exhausted at the time of resin injection. At the outer periphery at the rear end of the exhaust port 18 is formed a ridge-and-groove portion 19 for promoting fusion with a resin constituting a cord protector 20.

The detection end module SMJ, the connecting member module CMJ and the output circuit module OMJ are contained inside of the sheath case 13. After the rear opening of the sheath case 13 is closed by the end plug 15, a pressurized fusion resin is injected through the injection port 17 in the end plug 15, thereby filling the secondary injection type resin into the clearance defined inside of the sheath case 13, so as to seal the intrusion of water or oil from the outside. Thereafter, an electric cord 21 is soldered to the terminal pads 11*a* and 11*b* at the rear end 12 of the output circuit board 8 projecting from the slit 16 formed at the end plug 15. Subsequently, the assembly is introduced into a predetermined molding die, so that the cord protector 20 is insert-molded. Consequently, the proximity sensor of a cord fixing type is completed.

Figure 2:
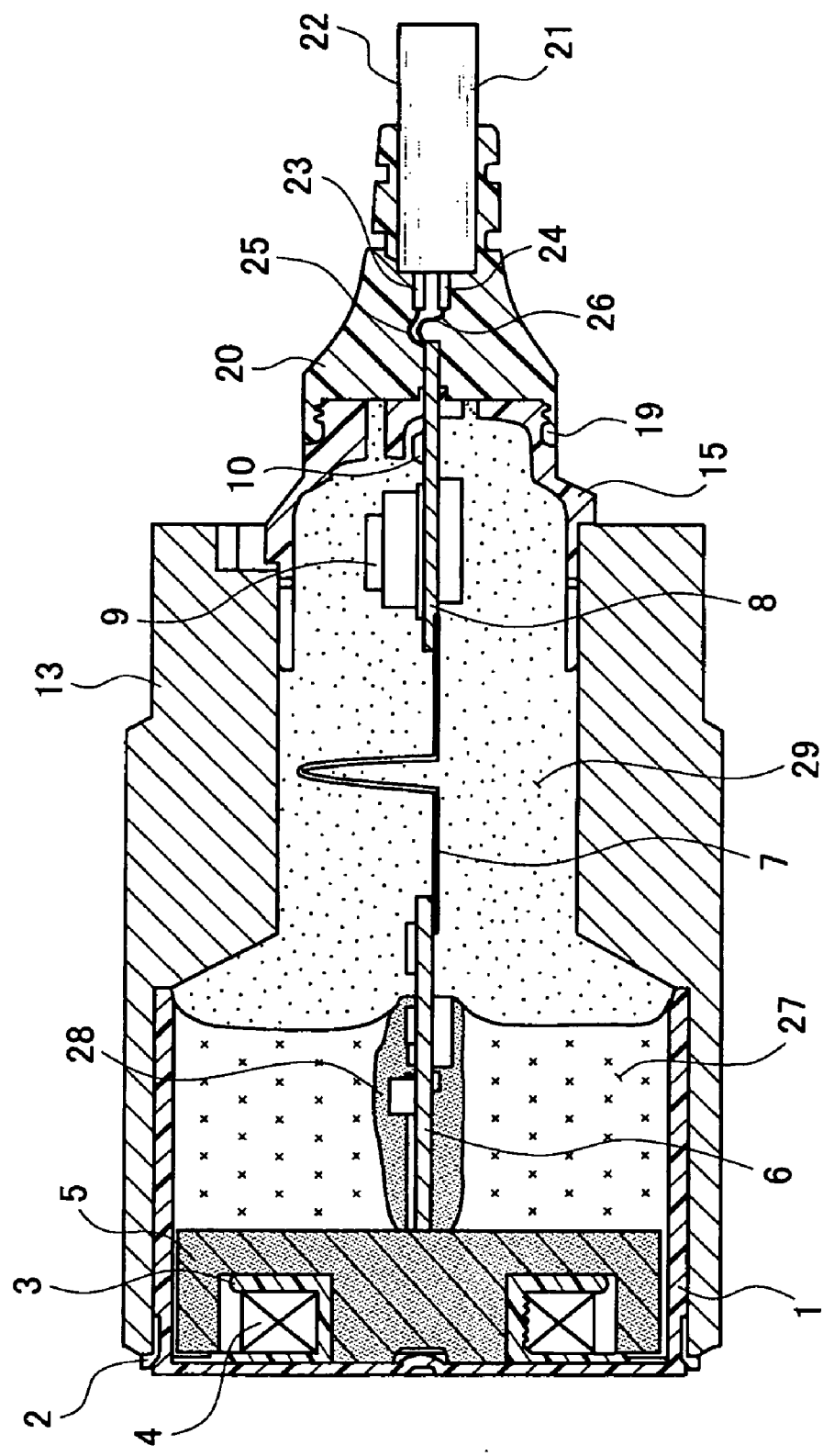
FIG. 2 is a longitudinal cross-sectional view showing the proximity sensor.

FIG. 2 is a schematically longitudinal cross-sectional view showing the proximity sensor assembled in the above-described manner. In FIG. 2, reference numeral 27 designates the primary injection type resin; 28, a sealing resin for sealing the detection circuit board 6; and 29, the secondary injection type resin for sealing the clearance defined inside of the sheath case 13. Furthermore, reference numeral 21 denotes the electric cord; 22, a sheath; 23 and 24, core wires; and 25 and 26, conductors.

Inside of the sheath case 13 of the proximity sensor as a complete product are filled the primary injection type resin 27 and the secondary injection type resin 29.

Figure 3:
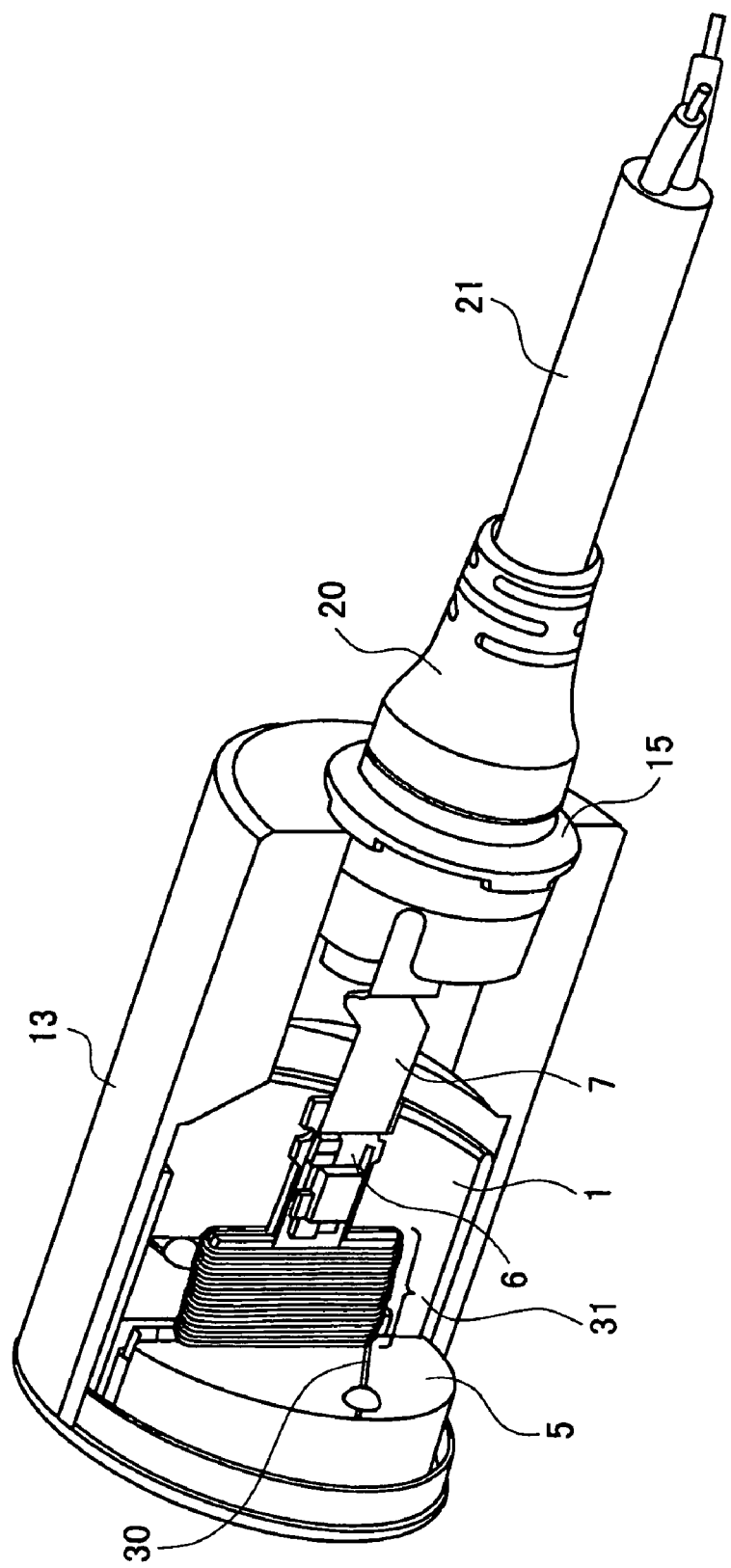
FIG. 3 is a partly cross-sectional perspective view showing the proximity sensor.

Next, FIG. 3 is a partly cross-sectional perspective view showing the proximity sensor in the state in which the primary injection type resin and the secondary injection type resin are removed. Reference numeral 31 is a planar wound portion of a coated electric wire. As described later, in the planar wound portion 31, a coated electric wire 30 is wound around a wide portion of the detection circuit board 6 in a planar manner. An electrostatic shield structure with respect to the detection circuit board 6 can be achieved by grounding the coated electric wire 30.

Subsequently, the producing procedures of the planar wound portion 31 will be explained below in reference to FIGS. 4 to 12.

Figure 4:
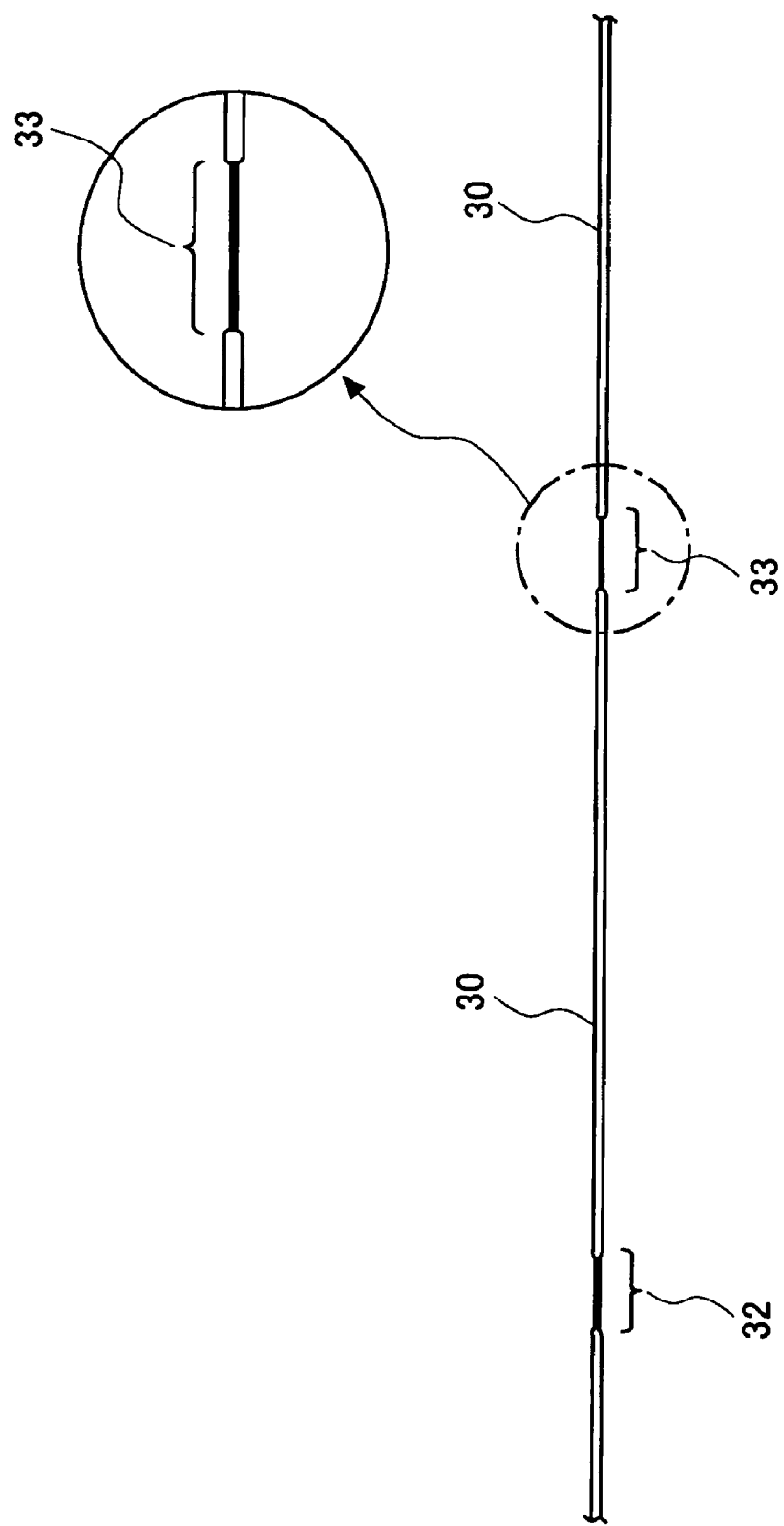
FIG. 4 is a diagram illustrating a coating removing process.
Figure 5:
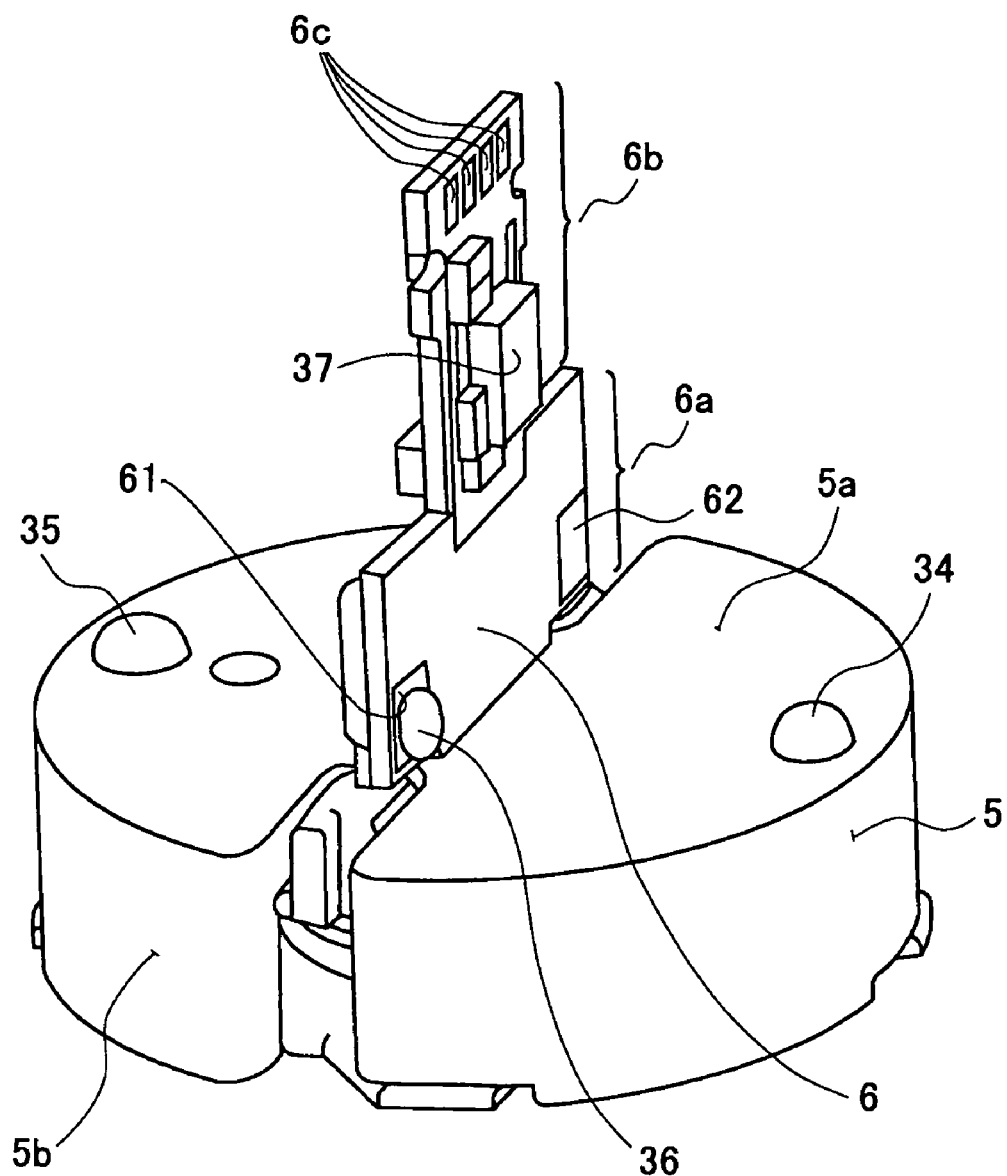
FIG. 5 is a diagram illustrating a solder bonding process.

FIG. 4 is a diagram illustrating a coating removing process. Explanation will be first made below on a preparation work for starting winding of the coated electric wire. In the preparation step, as shown in FIG. 4, the coating is fused and removed by irradiating a laser beam at two points on the coated electric wire 30, thereby forming a conductor exposed portion 32 and another conductor exposed portion 33. In the meantime, as shown in FIG. 5, work for attaching padding solders 34, 35 and 36 is performed on the side of the ferrite core 5 and the detection circuit board 6. Here, the attaching position of the padding solder 34 is located at a winding starting end of the coated electric wire 30; the attaching position of the padding solder 35 is located at a winding finishing end of the coated electric wire 30; and the attaching position of the padding solder 36 is located at a terminal pad 61 on the detection circuit board 6. The terminal pad 61 functions as a GND pattern. Incidentally, the ferrite core 5 is formed into a thin-type cylindrical shape having an end 5*a* and a core circumference 5*b*, on which a metallic deposition film is formed. The padding solders 34 and 35 are attached onto the metallic deposition film.

Figure 6:
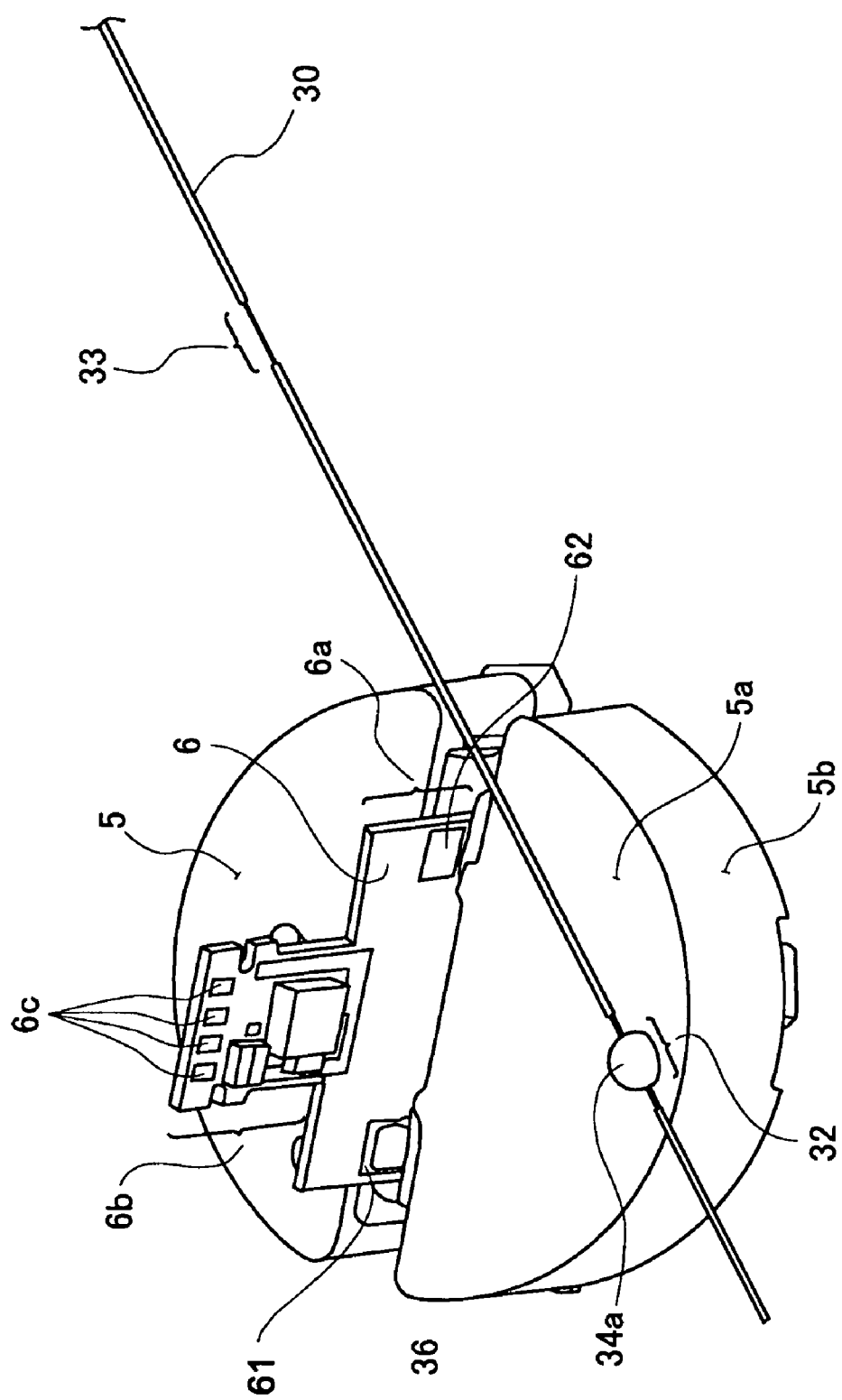
FIG. 6 is a diagram illustrating a welding process to a core at the beginning of winding.

Subsequently, as shown in FIG. 6, a welded solder 34*a* is formed by welding the conductor exposed portion 32 of the coated electric wire 30 to the padding solder 34 at the core end 5*a* of the ferrite core 5 by the irradiation of the laser beam, so that the winding starting end of the coated electric wire 30 is electrically connected to the core end of the ferrite core 5.

Figure 7:
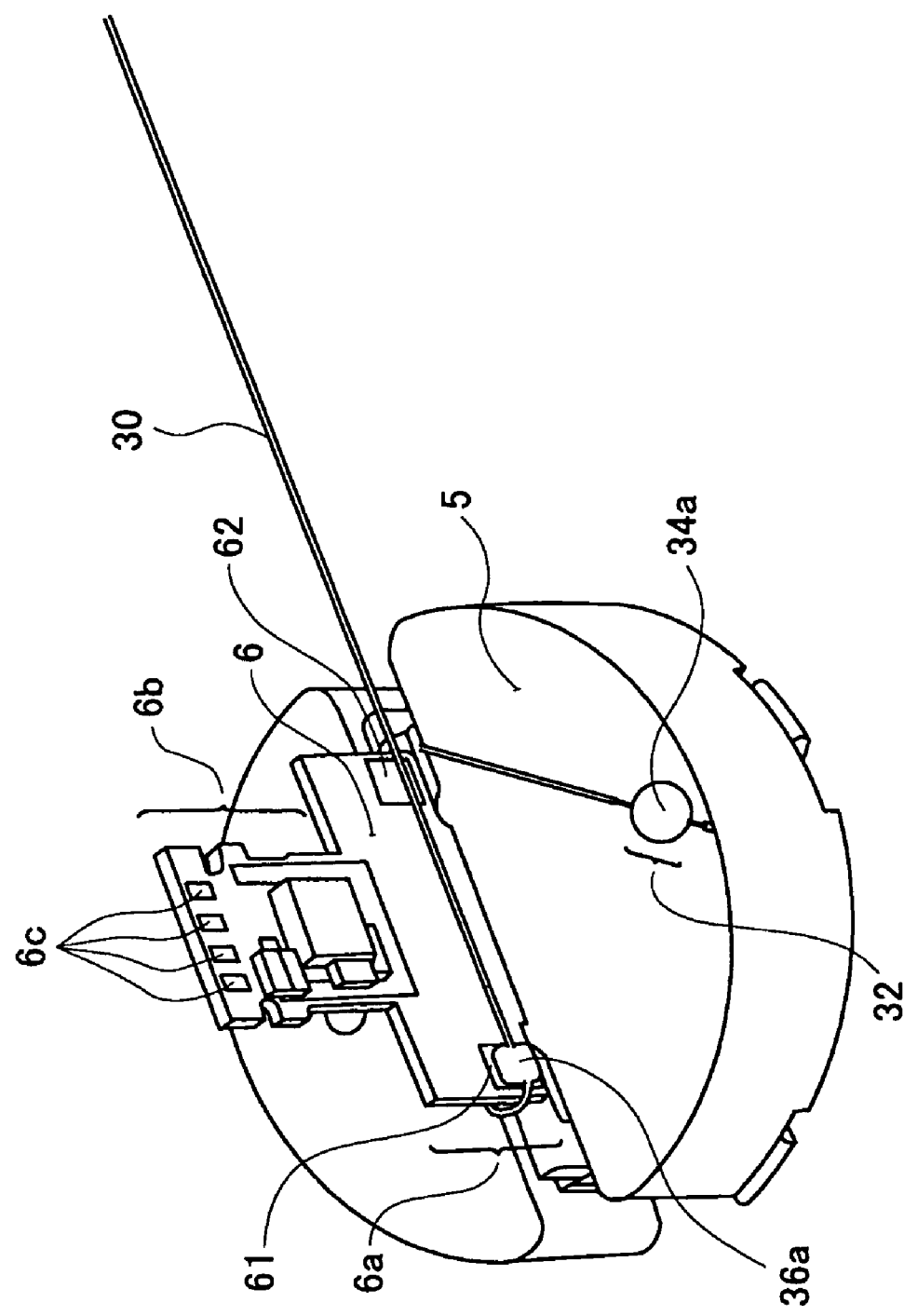
FIG. 7 is a diagram illustrating the welding process to a board at the time of one turn winding.

Next, as shown in FIG. 7, the conductor exposed portion 33 of the coated electric wire 30 is located at the padding solder 36 on the detection circuit board 6 by turning the coated electric wire 30 once around the detection circuit board 6, followed by the irradiation of the laser beam, thereby forming a welded solder 36*a*. As described above, since the terminal pad 61 having the padding solder 36 attached thereto functions as the GND pattern, the coated electric wire 30 is grounded to the GND pattern at the welded solder 36*a*.

The terminal pad 62 on the detection circuit board 6 is disposed opposite to the GND and on the side on which the terminal pad 62 is connected directly to the oscillation circuit. As shown in FIG. 6, after the coated electric wire 30 is fixed at the core end 5*a* via the welded solder 34, the coated electric wire 30 is started to be wound from a board edge on the side of the terminal pad 62. This is because a portion to be protected most from noise is "a lead wire of a detection coil" in "a spool on the side connected to the oscillation circuit", and therefore, the portion is wound without any clearance as possible. A positioning characteristic when the coated electric wire 30 is wound while being hooked at the edge of the board 6 is excellent when a hooked portion is flat, and consequently, the winding starting orientation is selected in this manner.

The reason why the coated electric wire 30 is welded at the terminal pad 61 is that countermeasures are taken for the fear of a short-circuiting between the coated electric wire 30 and the detection circuit board 6 (which occurs by peeling-off the coating of the coated electric wire 30 by the laser or generation of the peeling-off in a length of several millimeters). Specifically, a coil terminal pin 39 connected to the back of the terminal pad 61 is a GND terminal. Even if the coil terminal pin 39 and the coated electric wire 30 are short-circuited, there occurs no failure from the viewpoint of a circuit operation since they are GND potentials.

Figure 8:
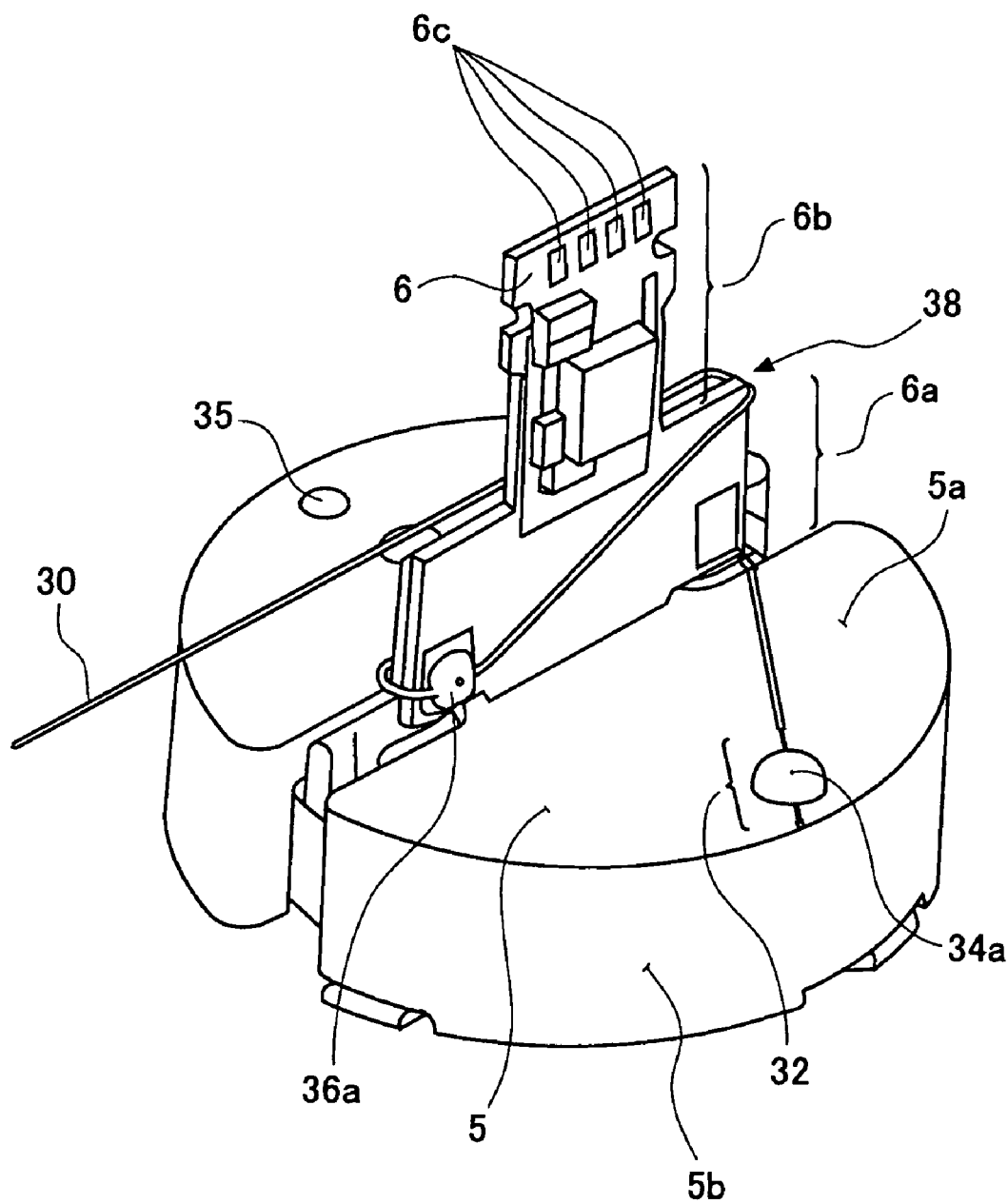
FIG. 8 is a diagram illustrating a transferring process to the upper end of a board.
Figure 9:
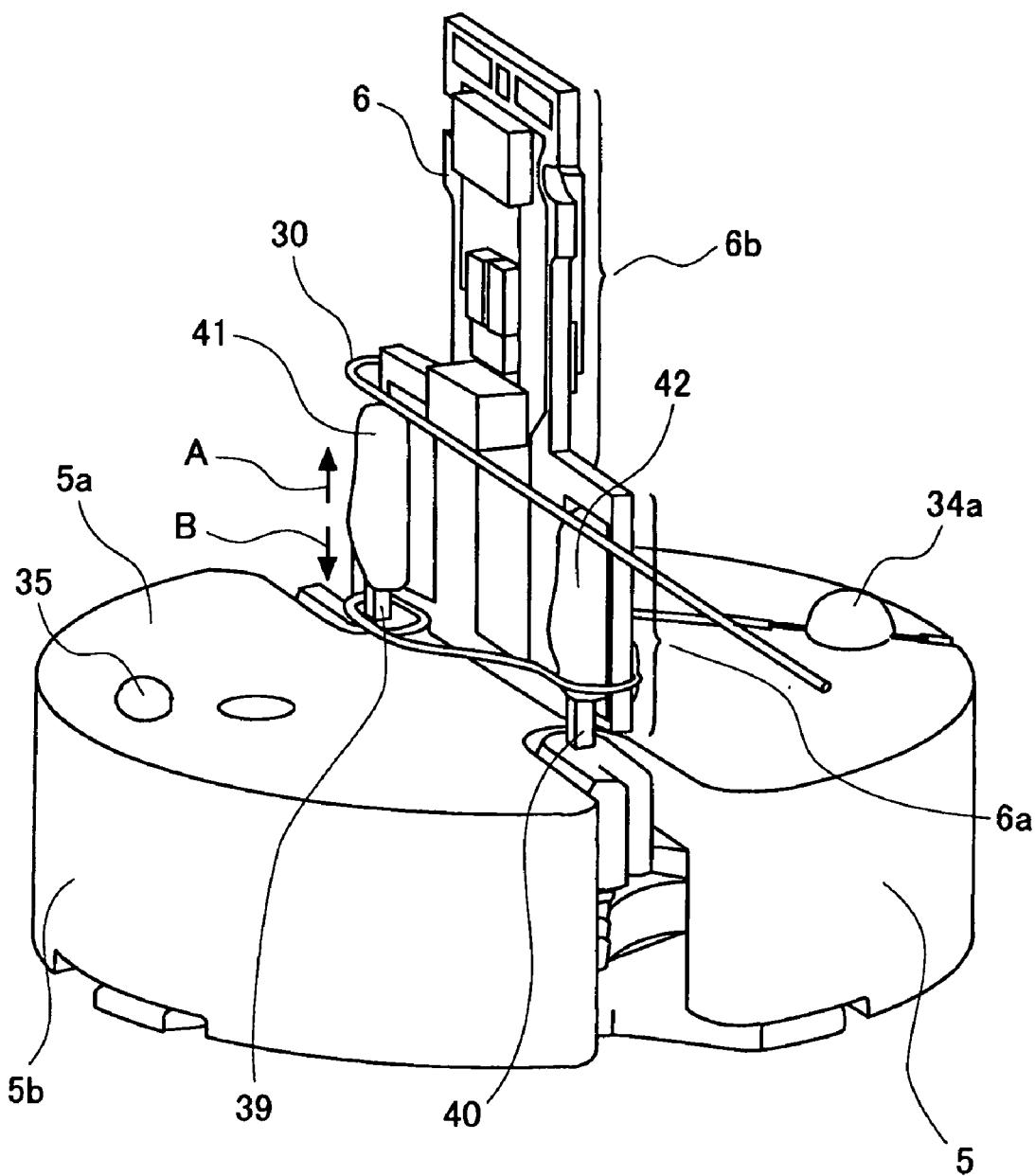
FIG. 9 is a diagram illustrating a winding-down starting process.

Subsequently, as shown in FIG. 8, the coated electric wire 30 fixed to the detection circuit board 6 via the welded solder 36a is pulled up to a shoulder 38 at an upper end in FIG. 8 at the wide portion 6a of the detection circuit board 6, and thereafter, the coated electric wire 30 is wound down from above to below, as shown in FIG. 9. Here, as shown in FIGS. 8 and 9, the coated electric wire 30 is pulled up from the welded solder 36a to the shoulder 38, and then, is pulled down. This is because a shield layer formed by the winding core should be only "a single layer". Since the clearance between the coil case 1 and the detection circuit board 6 is considerably small, if the winding coils are wound doubly or triply, the winding core shield layer may interfere at the time of insertion into the coil case 1.

Incidentally, there also is construed that the coated electric wire 30 is wound up from below to above. However, since a swelled-up portion is formed at the coil terminal pins 39 and 40 due to the connection of the coil wire and the solder, as shown in FIG. 9, the coated electric wire 30 is slipped off due to the inclination of the swelled-up portion when the coated electric wire 30 is wound up at the swelled-up portion, thereby inducing a fear of the difficulty in winding at a uniform pitch. Actually, the winding coil is slipped off along the inclination from top to root at a portion at which the coated electric wire 30 is wound up in sequence from below to above, as indicated by arrows A and B in FIG. 9, thereby resulting in the relative difficulty in uniformly winding. In contrast, in the case where the coated electric wire 30 is wound down in sequence from above to below, as shown in FIGS. 9 and 10, the coated electric wire 30 can be wound at a uniform pitch with relative ease.

Figure 10:
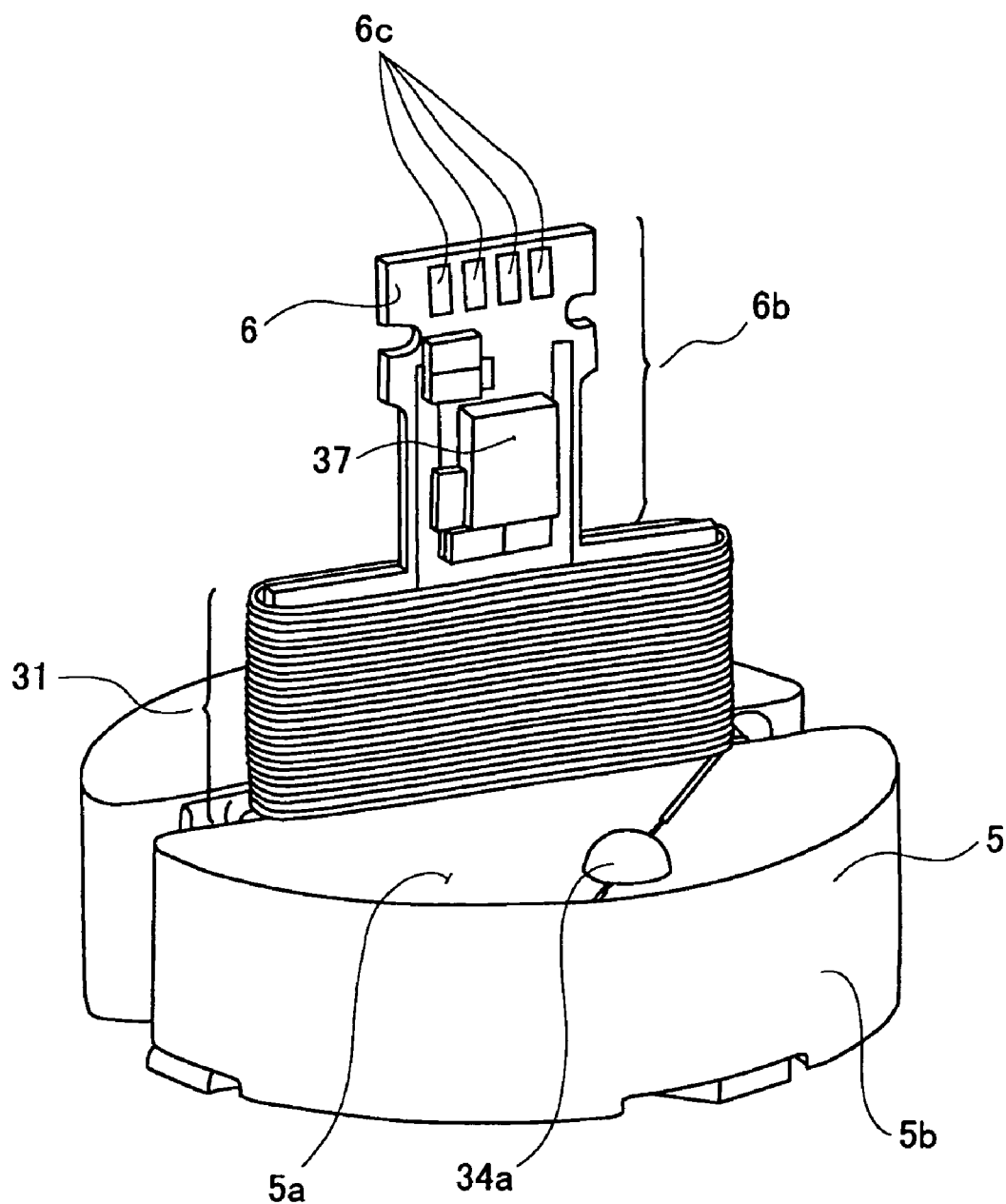
FIG. 10 is a diagram illustrating a winding-down completing process.

Thereafter, as shown in FIG. 10, the coated electric wire 30 is wound down in sequence in a single layer from above to below around the wide portion 6a, thereby forming the planar wound portion 31. Since the planar wound portion 31 is formed of a conductor in a layered manner, it is grounded to the GND pattern at the welded solder 36a, to effectively function as an electrostatic shield member. Furthermore, the planar wound portion 31 formed in the above-described manner is insulated by the insulating coating in the direction of the adjacent coated electric wire, i.e., in a direction transverse to the coated electric wire, and therefore, no current flows. And then, even if a high frequency magnetic field generated from the detection coil 4 travels transversely to the planar wound portion 31 to thus generate an eddy current electromotive force, no eddy current flows in a direction transverse to the winding coil. Consequently, an eddy current loss hardly occurs, thus avoiding any degradation of the characteristics of the proximity sensor.

Figure 11:
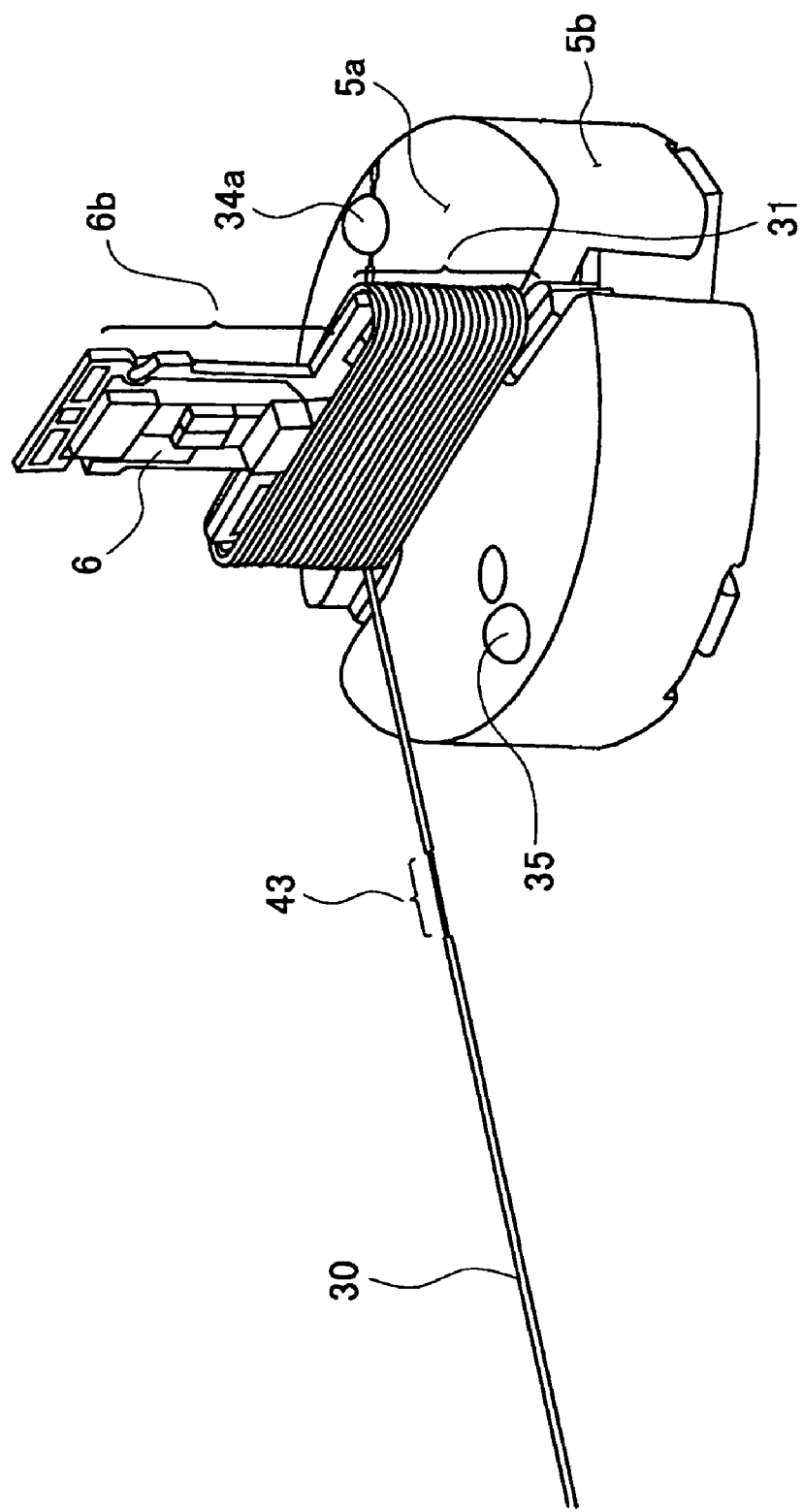
FIG. 11 is a diagram illustrating a coating removing process of a winding finishing end.
Figure 12:
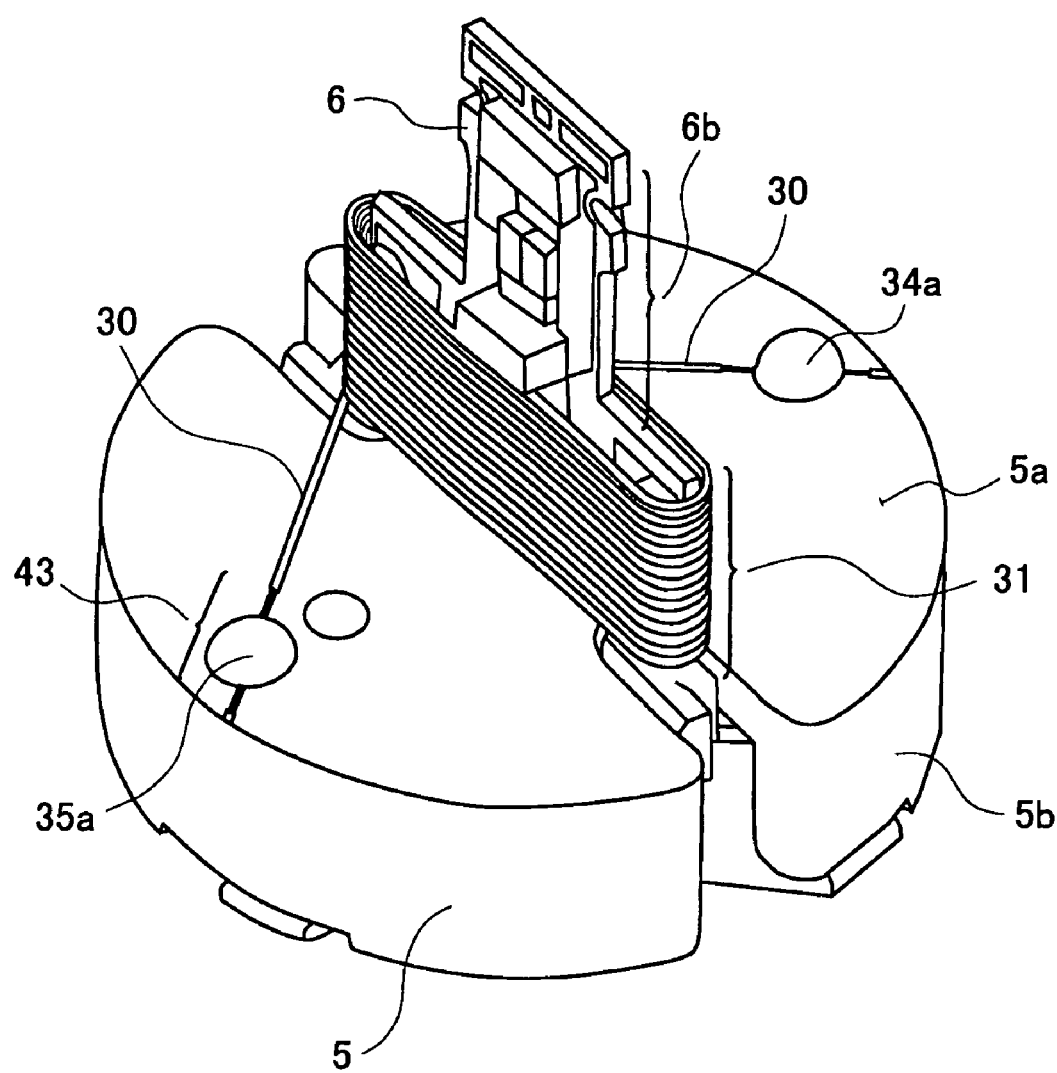
FIG. 12 is a diagram illustrating the welding process to the core at the time of winding completion.

Finally, as shown in FIGS. 11 and 12, a conductor exposed portion 43 is formed by irradiating the laser beam onto the coated electric wire 30, to be located at the padding solder 35 at the core end 5a, and then, the conductor exposed portion 43 is welded at the core end 5a by the irradiation of the laser beam. In this manner, as shown in FIG. 12, the coated electric wire constituting the shield layer is electrically connected to the ferrite core at two points on the core end 5a, i.e., at the welded solders 34a and 35a. Furthermore, the coated electric wire 30 is electrically connected to the GND potential at the terminal pad 61, so that the potential of the metallic deposition film of the ferrite core 5 is stabilized at the GND potential.

Thereafter, as shown in FIG. 12, the coated electric wire 30 continuous to the conductor exposed portion 43 is cut out, thereby completing the planar wound portion 31 at which the coated electric wire is tightly wound in a planar manner around the wide portion 6a of the detection circuit board 6. The planar wound portion 31 is connected to the GND potential, thereby completing the electrostatic shield structure. Furthermore, since the coated electric wire 30 are connected at the two points also to the ferrite core 5, the potential of the metallic deposition film of the ferrite core 5 becomes the GND potential, thereby contributing to the operating stabilization. A welded point between the coated electric wire 30 and the metallic deposition film of the ferrite core 5 may be disconnected by a stress exerted at the time of the expansion or contraction during or after hardening when the primary injection type resin 29 is injected. However, the coated electric wire 30 is connected at the two points in the present preferred embodiment, the electrostatic shielding effect of the metallic deposition film can be maintained even if the coated electric wire 30 is disconnected at either one of the two points.

Additionally, the work of winding the coated electric wire around the wide portion 6a of the detection circuit board 6 can be easily automated by a coil winding machine or the like, and thus, it is possible to provide the electrostatic shield structure in the proximity sensor of this kind at a reduced cost.

Next, FIGS. 13A to 13D illustrate examples of electric wires applicable to the shield structure in the coil according to the present invention. FIG. 13A illustrates a single-layer coated electric wire; FIG. 13B illustrates a double-layer coated electric wire (a first example); FIG. 13C illustrates a double-layer coated electric wire (a second example); and FIG. 13D illustrates a triple-layer coated electric wire.

As illustrated in FIG. 13A, the single-layer coated electric wire includes a single copper wire 44 serving as a conductor and a polyurethane film 45. The coated electric wire can be used as a coil wire for a detection coil in the preferred embodiment of the above-described proximity sensor. The approximate thickness of the polyurethane film is 0.01 mm, and the outer diameter of the entire coated wire ranges from 0.02 mm to 0.60 mm. Such a single-layer coated electric wire is called a coil wire widely used in general, and is used for a relay coil, a transformer, a small-sized motor, a communication coil and the like. It is very high in versatility and is low in material cost. However, in the case where the single-layer coated electric wire is wound directly around the board, there is a fear of a damage imparted at the end edge of the board. Therefore, it is preferable that a round should be provided by covering the end edge of the board with an insulating tape or the like, and then, the single-layer coated electric wire should be wound. Otherwise, an insulating layer has been previously formed at the surface of the board. As the insulating layer may be used a silicon potting, a cylindrical resin member, a thermally contractile tube and the like.

The double-layer coated electric wire (the first example) illustrated in FIG. 13B includes a single copper wire 46 serving as a conductor, a first film 47 made of polyurethane and a second film 48 made of polyester. Each of the first film 47 and the second film 48 is an extrusion coating. In the case where a finest wire is selected, the diameter of the conductor is 0.11 mm, and the outer diameter of the polyester film is about 0.18 mm. In the case where the diameter of the conductor is 0.11 mm, the approximate thickness of the polyurethane film is 0.01 mm and the approximate thickness of the polyester film is 0.025 mm.

The features include a high insulating property since the double-layer insulating film has durability with respect to machining; an excellent space efficiency owing to a small sheath diameter, although the insulating property is slightly lower than the triple-layer insulating film; a material cost lower than the triple-layer coated electric wire; and the like.

The double-layer coated electric wire (the second example) illustrated in FIG. 13C includes a single copper wire 49 serving as a conductor, a first film 50 made of polyurethane and a second film 51 made of nylon. The second nylon film is formed by baking a nylon resin. The outer diameter ranges from about 0.02 mm to about 0.55 mm. The approximate thickness of the polyurethane film is 0.01 mm, and the approximate thickness of the nylon film is 0.005 mm.

The features of the coated electric wire include a low material cost because of a generally used coil wire, machining resistance, and excellent degradation characteristics. However, an edge cannot have resistance in the case where the coated electric wire is wound directly around the board. In this case, after the edge is covered with an insulating tape or the like, the coated electric wire must be wound.

The triple-layer coated electric wire illustrated in FIG. 13D includes a single copper wire 52 serving as a conductor, a first film 53 made of polyurethane, a second film 54 made of polyester and a third film 55 made of polyamide. The diameter of the conductor is 0.11 mm, and the outer diameter of the polyamide film is 0.24 mm. In the case where the diameter of the conductor is 0.11 mm, the approximate thickness of the polyurethane film is 0.01 mm, the approximate thickness of the polyester film is 0.028 mm and the approximate thickness of the polyamide film is 0.028 mm.

The features include resistance with respect to the edge of the board owing to the triple-layer insulting film and a sufficient insulating property.

In the above-described preferred embodiment, there can be produced the following effects.

(1) Since the shield unit is constituted of the coated electric wire which is inexpensive in material cost, a remarkable cost reduction can be expected.

(2) Since the shield unit is constituted by winding the coated electric wire around the circuit board, only a single kind of coated electric wire can cope with products of various sizes. Consequently, the shield members need not be prepared for each kind of products, thereby facilitating the management of members.

(3) Since the shield unit is constituted by winding the coated electric wire around the circuit board, the assembling automation can be achieved with ease by the use of a winding machine.

(4) A lead wire or a copper foil for welding the metallic deposition portion of the coil core to the GND of the circuit board is not needed, thereby achieving reduction of the material cost.

(5) The automation of electric welding of the shield unit to the GND of the circuit board can be achieved with ease.

(6) The automation of electric welding of the metallic deposition portion of the coil core to the GND of the circuit board can be achieved with ease.

(7) Since the coated electric wire is wound on the electronic part mounted on the circuit board, the electronic part can be protected from the outside. Consequently, it is possible to alleviate the exertion of the stress of the injection type resin on the electronic part, so as to prevent any peeling-off or crack of the electronic part.

(8) In the case of the common use as the coated wire for the detection coil, the same material can be used as the wire rod for the detection coil and the shield unit, thereby integrating the members so as to achieve stock control and reduce the cost.

(9) In the case where the same material is used by the common use of the detection coil, the same equipment is used in the process of winding the detection coil and in the process of winding the shield, thereby reducing the equipment cost and the number of processes.

(10) Since the shield unit which can be fitted to the circuit board or the electronic part having the coated electric wire wound therearound can be constituted, the mounting efficiency is excellent without any necessity of previous provision of an extra space in comparison with the planar winding with the film with the copper foil in the prior art.

The detection end module in the proximity sensor is constituted by integrating the detection circuit board having the detection circuit mounted thereon, the core and the detection coil, wherein in particular, no output circuit is included in the detection circuit board. A board having an output circuit mounted thereon is prepared independently of the detection circuit board, and further, a plurality of kinds of detection end modules and output circuit boards are prepared. In this manner, many kinds of proximity sensor devices can be fabricated in combination. The detection end module may be put into circulation in a single unit as an intermediate product for the proximity sensor device. If the electrostatic shield layer is formed by winding the coated electric wire around the detection circuit board in the detection end module, the volume of the detection end module is slightly increased, and further, the shield layer can be hardly broken at the time of handling in comparison with the winding of the film with the copper foil since the shield layer is integrated with the detection circuit board in substantial contact. Consequently, it is possible to easily handle the intermediate product of the detection end module.

Figure 14:
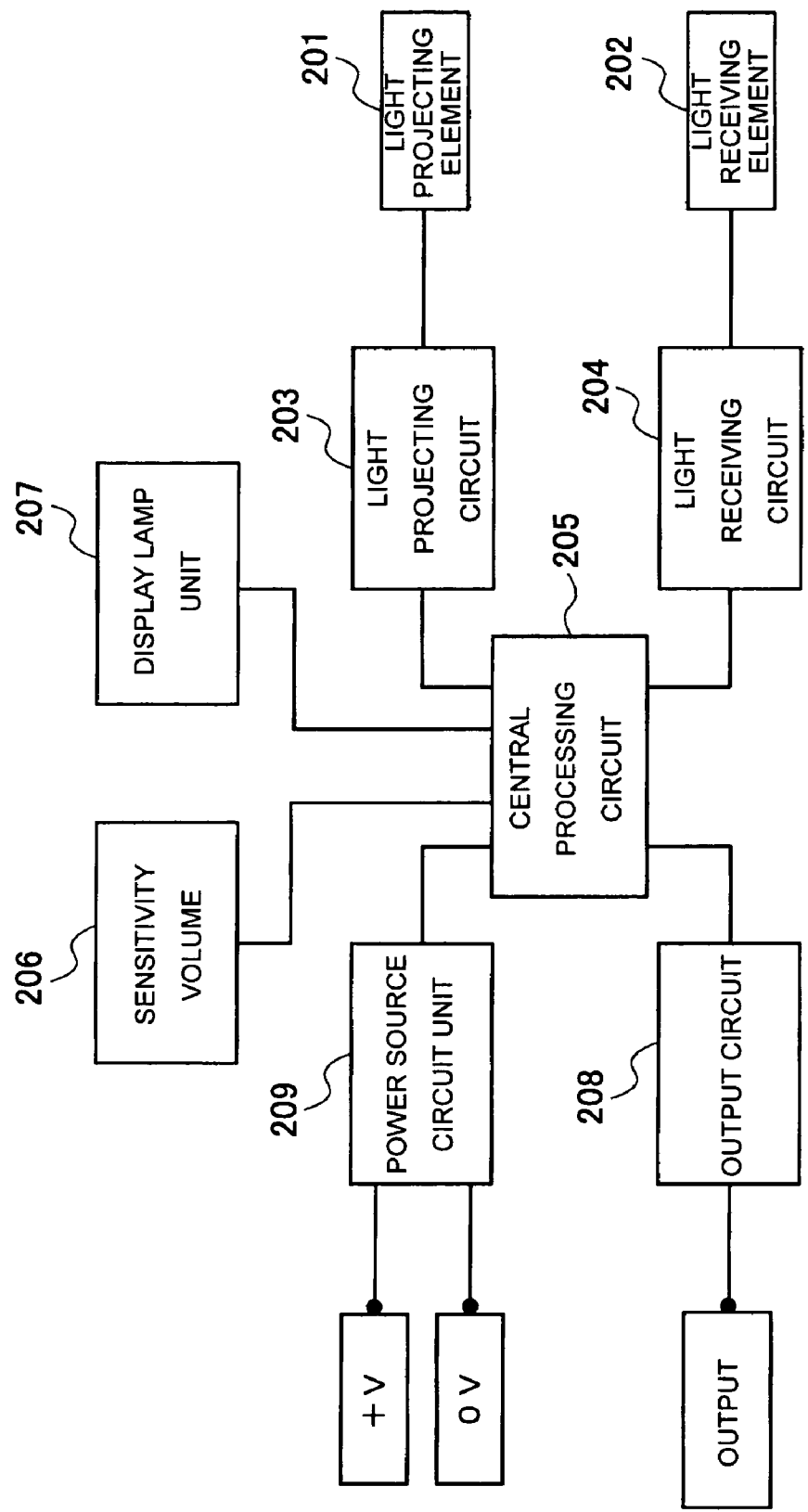
FIG. 14 is a circuit block diagram illustrating an photoelectric sensor.

Next, FIG. 14 is a circuit block diagram illustrating an photoelectric sensor, to which the present invention is applied. A light projecting/receiving system of the photoelectric sensor includes a light projecting element 201 constituted of an LED, a light receiving element 202 constituted of a photodiode, a light projecting circuit 203 for allowing the light projecting element 201 to emit light, and a light receiving circuit 204 for converting a current output signal from the light receiving element 202 into a voltage signal and amplifying the signal. In the present preferred embodiment, the light receiving circuit 204 corresponds to the detection circuit according to the present invention.

A central processing circuit 205 is constituted of an ASIC, controls the light projecting circuit 203 in such a manner that the light projecting element 201 is lighted at a pulse of a predetermined cycle, and further, acquires an output signal (i.e., a light receiving signal) from the light receiving circuit 204 in synchronism with a lighting timing of the light projecting element 201. Moreover, the central processing circuit 205 has a threshold value with respect to the light receiving signal, and thus, determines a light receiving state under the condition where the magnitude of the light receiving signal exceeds the threshold value sequentially predetermined times. The threshold value can be adjusted by a sensitivity volume 206. A display lamp unit 207 includes two display lamps, i.e., an operating display lamp and a stabilizing display lamp. The operating display lamp is lighted when a light receiving state is determined. The stabilizing display lamp is lighted when a light receiving signal greater by a preset rate than the threshold value is obtained. An output circuit 208 converts a determination result signal into an electric signal having predetermined specifications, and then, outputs the electric signal to the outside. A power source circuit unit 209 receives a DC power source input within a predetermined volume range from the outside, converts the input into a voltage required inside of the sensor, and then, supplies the power source to each of the circuits.

In the present preferred embodiment, a coated electric wire 217 is wound around the light projecting element 201, the light receiving element 202, the light projecting circuit 203, the light receiving circuit 204, the central processing circuit 205, the output circuit 208 and the power source circuit unit 209, followed by electrostatic shielding. Only the light receiving circuit 204 may be electrostatically shielded.

Figure 15:
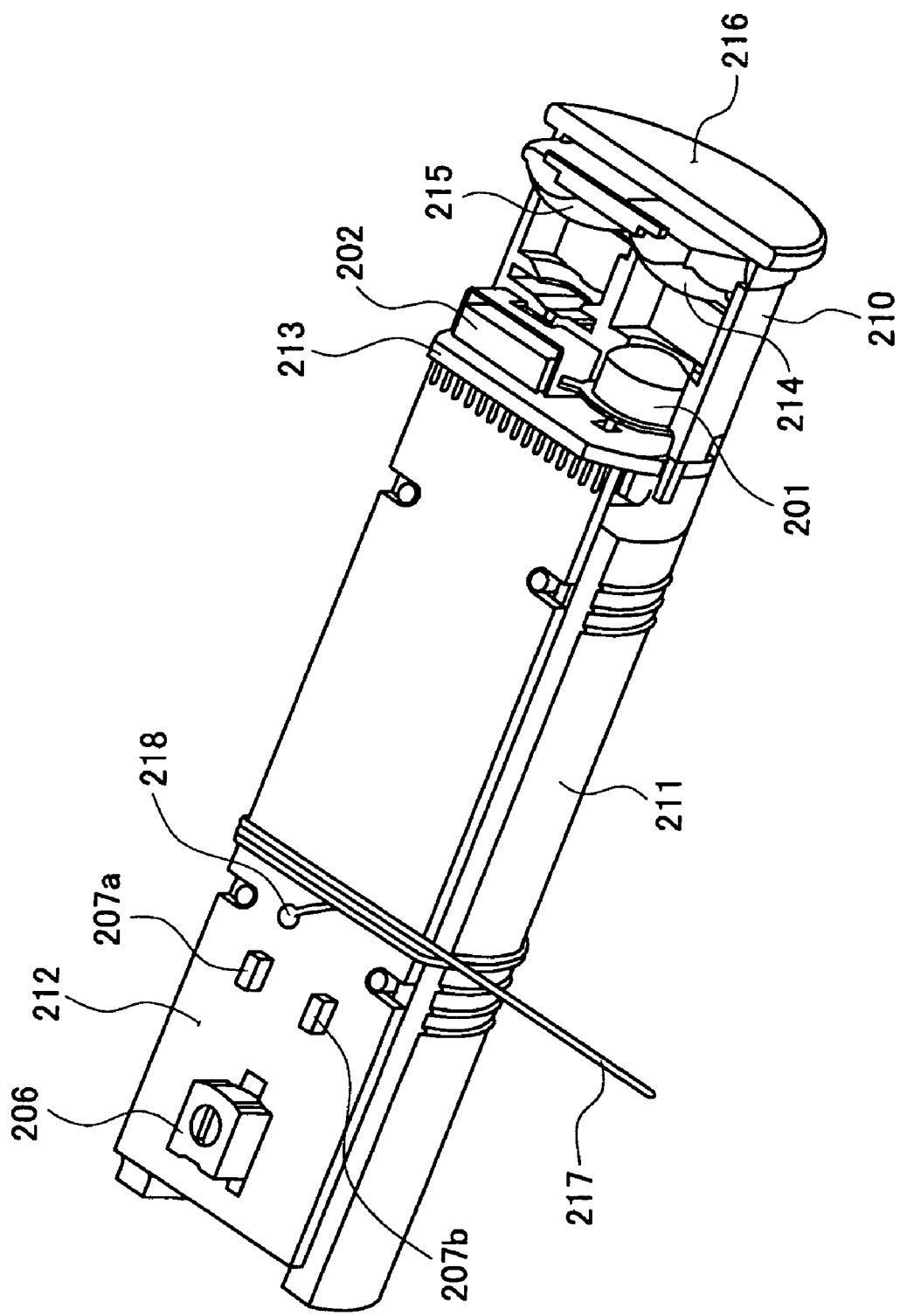
FIG. 15 is a partly broken perspective view showing the assembly of the photoelectric sensor, from which a case is removed.

FIG. 15 is a partly broken perspective view showing the assembly of the photoelectric sensor, from which a case is removed. In FIG. 15, the upper half of an optical holder 210 is removed, and is shown in cross section. In FIG. 15, a board holder 211 is made of a resin, for holding a main circuit board 212. On the main circuit board 212 are mounted the circuits shown in FIG. 14 except for the light projecting element 201 and the light receiving element 202. In this manner, the light receiving circuit 204 serving as the detection circuit and the other circuits are mounted on the main circuit board 212. Here, the main circuit board 212 corresponds to the detection circuit board according to the present invention. Signals are transmitted between the light projecting element 201 and the main circuit board 212 and between the light receiving element 202 and the main circuit board 212 via a light projecting/receiving element board 213. In addition, in FIG. 15, reference numeral 214 designates a light projecting lens; 215, a light receiving lens; 216, a lens cover; 217, the coated electric wire; 218, a connecting portion; and 207a and 207b, display lamps constituting the display lamp unit.

Figure 16:
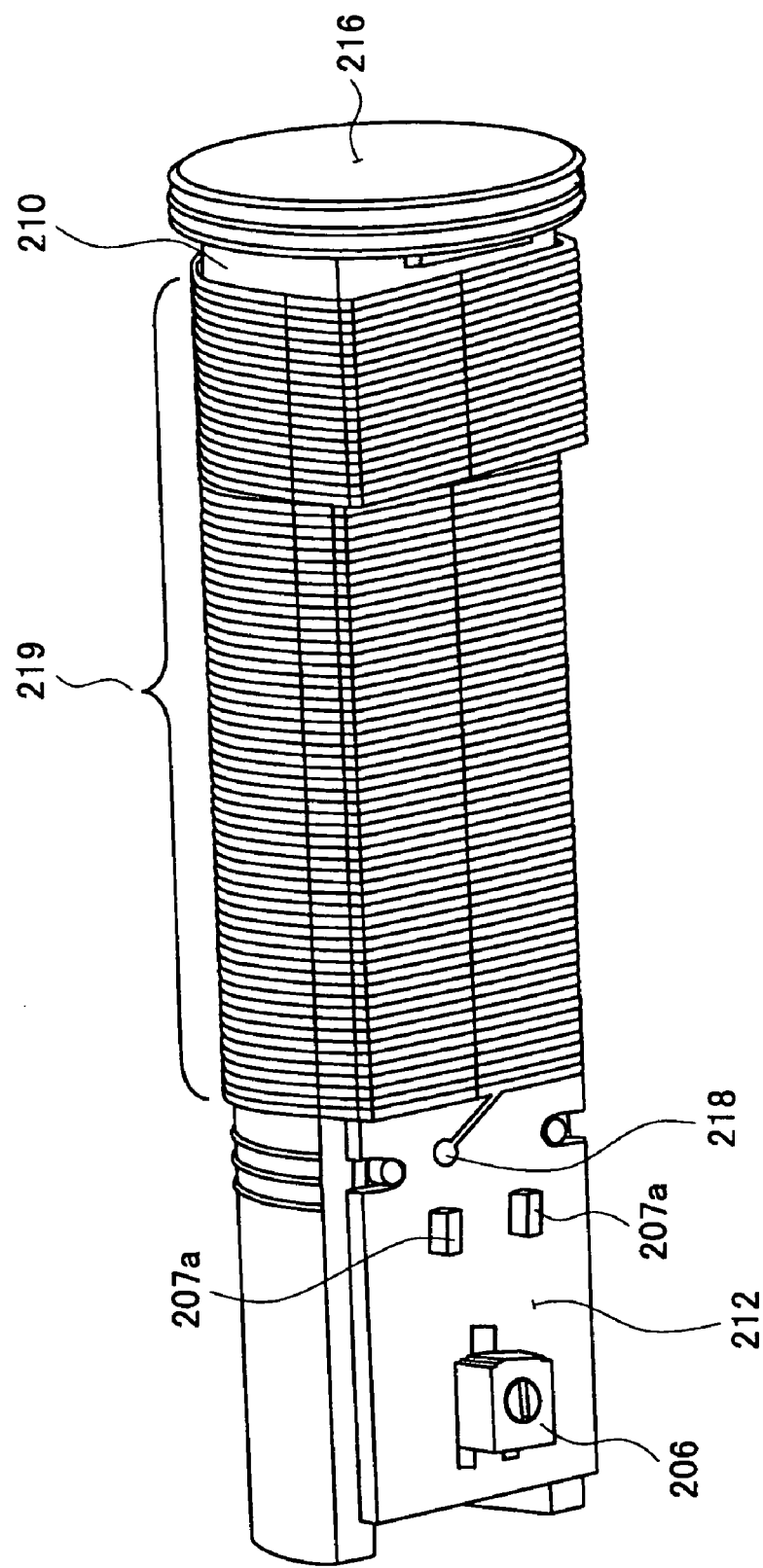
FIG. 16 is a perspective view showing the assembly of the photoelectric sensor in the state in which the coated electric wire is completed to be wound.

FIG. 16 illustrates the state of the assembly of the photoelectric sensor when the coated electric wire is completed to be wound, as viewed at an angle other than in FIG. 15. A region denoted by reference numeral 219 is a coil shield region. As is clear from FIG. 16, the coated electric wire 217 is wound also around the optical holder 210 incorporating the light receiving element 202 therein. The terminal end of the coated electric wire 217 is securely bonded to the optical holder 210. Here, a lock portion may be formed at the optical holder 210, and the coated electric wire 217 may be securely hooked on the lock portion.

Figure 17:
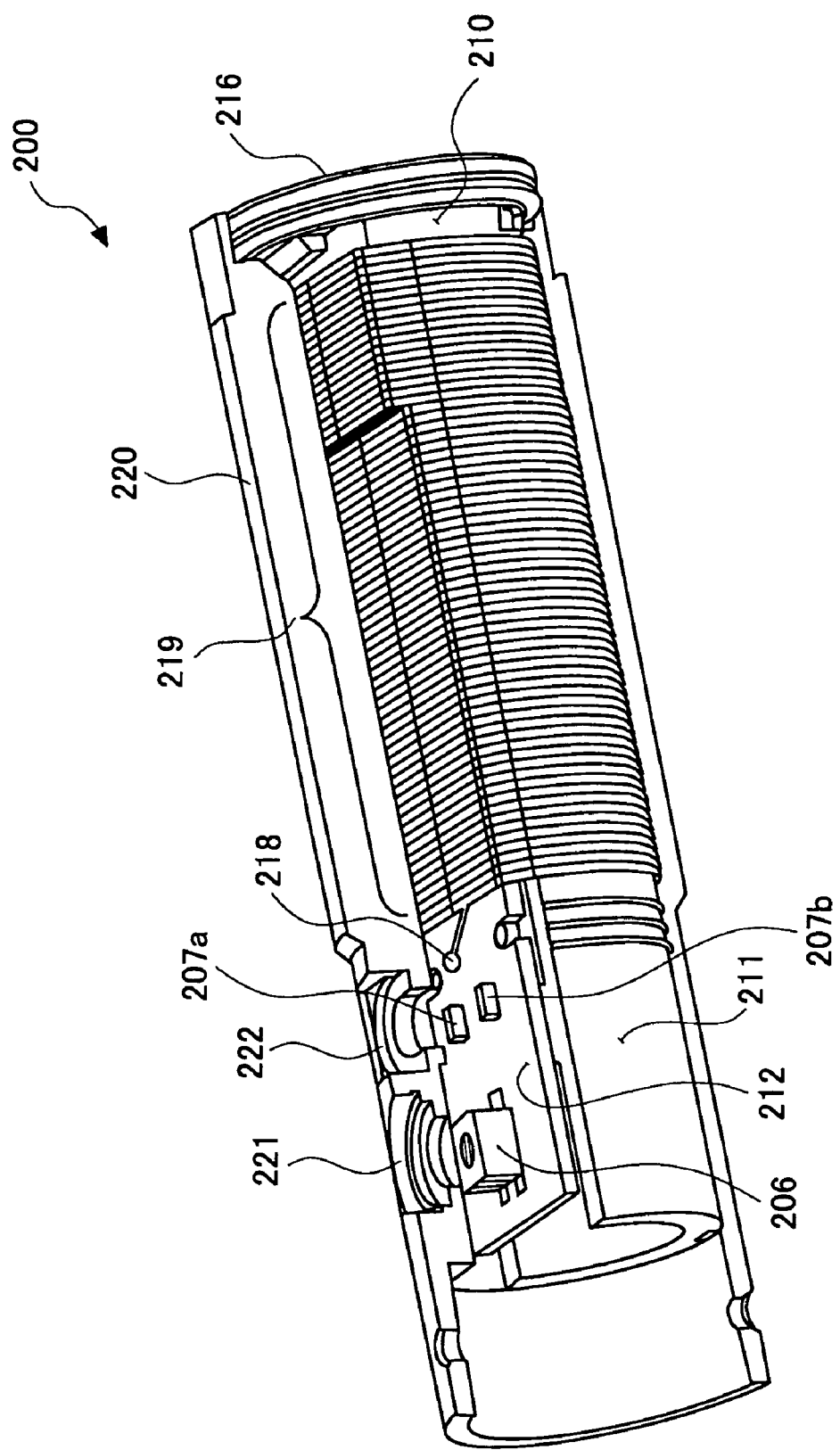
FIG. 17 is a partly broken perspective view showing the assembly of the photoelectric sensor, which is contained in the case.

FIG. 17 illustrates the state in which the assembly of the photoelectric sensor is contained in a case 220. In the present preferred embodiment, the case 220 is shown in cross section. The case 220 is made of a resin or metal. A hole 221 for operating the sensitivity volume 206 is formed at the case 220. A relay member, not shown, for transmitting the rotation of a driver held by an operator to the sensitivity volume 206 is inserted into the hole 221. Another hole 222 for visually confirming the display lamps 207a and 207b is formed at the case 220. A transparent window member, not shown, is fitted to the hole 222.

A projection at the side of the board holder 211 abuts against the inner surface of the case 220. The board holder 211 is not a semi-split cylinder in a strict sense, but is formed into a C-shaped cylinder in cross section having an angle in excess of 180° on a center axis. Consequently, when the board holder 211 is inserted into the case 220, the board holder 211 can be held without any play inside of the case 220. Moreover, a groove is formed at the lower surface of the board holder 211 in parallel to the center axis. The projection at the inner surface of the case is inserted into the groove, so that the board holder 211 is prevented from being turned with respect to the case 220. With the above-described structure, the board holder 211 can be positioned with respect to the case 220 only by inserting the board holder 211 into the case 220 from the front of the case 220. Additionally, since the shape of the board holder 211 is substantially half-split cylinder with few irregular portion, the coated electric wire 217 can be easily wound in alignment. There is no interference disturbing the winding in alignment of the coated electric wire 217 at a surface on a side in contact with the coated electric wire 217 in the main circuit board 212 if parts are mounted only at a surface on a side of the board holder 211 at a portion of the main circuit board 212 to be wound with the coated electric wire 217, so that the coated electric wire 217 can be more easily wound in alignment, and further, a fear of short-circuiting between the coated electric wire 217 and the circuit can be more reduced. The above-described photoelectric sensor further has a cap structure at the rear end of the case and a cable drawing structure. However, their illustrations and explanations will be omitted here.

What is claimed is:

1. A sensor device comprising:
   a coated electric wire wound around a detection circuit in a planar manner so as to electrostatically shield the detection circuit, wherein the electric wire is coated with an insulating material;
   a detection circuit board having the detection circuit; and
   a cylindrical case;
   wherein the coated electric wire is wound around the detection circuit board in a cylindrical manner so as to form a cylindrical surface, and the direction of an axis of the cylindrical surface is parallel to the direction of the axis of the case.

2. The sensor device according to claim 1, wherein the coated electric wire is spirally wound around the detection circuit in a single manner.

3. The sensor device according to claim 1, wherein the sensor device is a proximity sensor device comprising a detection coil having a core; and
   the detection circuit includes an oscillation circuit having the detection coil serving as a resonance element.

4. The sensor device according to claim 3, wherein a metallic film for electrostatically shielding the detection coil is formed at the outer surface of the core, and the coated electric wire is electrically connected to the metallic film of the core.

5. The sensor device according to claim 4, further comprising:
   a detection circuit board having the detection circuit;
   wherein both ends of the coated electric wire are electrically connected to the metallic film of the core, and are electrically connected to a ground pattern of the detection circuit board at the intermediate portion of the coated electric wire.

6. The sensor device according to claim 3, wherein the coating strength of the coated electric wire for use in shielding is greater than that of the coated electric wire to be used as a coil wire of the detection coil.

7. The sensor device according to claim 3, wherein the coated electric wire for use in shielding is the same kind of coated electric wire to be used as a coil wire of the detection coil.

8. A sensor device comprising:
   a coated electric wire wound around a detection circuit in a planar manner so as to electrostatically shield the detection circuit, wherein the electric wire is coated with an insulating material, wherein the sensor device is a photoelectric sensor device including a light receiving element for converting light from a region to be detected into an electric signal; and a signal relating to the state of the region to be detected is output based on an output from the light receiving element.

9. The sensor device according to claim 8, wherein the coated electric wire is wound also around the light receiving element in a planar manner.

10. The sensor device according to claim 8, further comprising:

a detection circuit board having the detection circuit;

a cylindrical case; and a semi-split cylindrical board holder which supports the detection circuit board and is contained inside of the case;

wherein the coated electric wire is wound around the detection circuit board and the board holder in a planar manner.

* * * * *